United States Patent
Sung et al.

(10) Patent No.: US 8,008,851 B2
(45) Date of Patent: Aug. 30, 2011

(54) ORGANIC LIGHT EMITTING DISPLAY

(75) Inventors: Myeon Chang Sung, Seoul (KR); Changnam Kim, Seoul (KR); Sangkyoon Kim, Hanam-si (KR); Sun Kil Kang, Anyang-si (KR); Won Jae Yang, Gimpo-si (KR); Honggyu Kim, Uiwang-si (KR); Young Hoon Shin, Seoul (KR); Do Youl Kim, Seoul (KR); Honyun Lee, Gyeonggi-do (KR); Myung Jong Jung, Seoul (KR)

(73) Assignee: LG Display Co., Ltd., Seoul (KR)

( * ) Notice: Subject to any disclaimer, the term of this patent is extended or adjusted under 35 U.S.C. 154(b) by 398 days.

(21) Appl. No.: 11/654,635

(22) Filed: Jan. 18, 2007

(65) Prior Publication Data

US 2007/0164277 A1 Jul. 19, 2007

(30) Foreign Application Priority Data

Jan. 19, 2006 (KR) .................. 10-2006-0006010
Jan. 20, 2006 (KR) .................. 10-2006-0006537

(51) Int. Cl.
*H05B 33/26* (2006.01)
(52) U.S. Cl. ......... 313/504; 313/506; 313/507; 313/509
(58) Field of Classification Search .......... 313/498–512; 315/169.3; 345/36, 45, 76
See application file for complete search history.

(56) References Cited

U.S. PATENT DOCUMENTS

| | | | |
|---|---|---|---|
| 6,337,492 B1* | 1/2002 | Jones et al. ............... | 257/40 |
| 6,864,638 B2* | 3/2005 | Ishihara et al. .......... | 315/169.3 |
| 7,161,185 B2* | 1/2007 | Yamazaki et al. ........ | 257/88 |
| 7,679,283 B2* | 3/2010 | Nimura .................... | 313/506 |
| 2003/0170491 A1* | 9/2003 | Liao et al. ............... | 428/690 |
| 2004/0195572 A1 | 10/2004 | Kato et al. | |
| 2004/0227159 A1 | 11/2004 | Nakashima et al. | |
| 2004/0263056 A1* | 12/2004 | Seo et al. ............... | 313/500 |
| 2004/0263425 A1 | 12/2004 | Anzai et al. | |
| 2005/0012465 A1* | 1/2005 | Uchida .................... | 315/169.3 |
| 2005/0123751 A1* | 6/2005 | Tsutsui et al. .......... | 428/364 |
| 2005/0236981 A1* | 10/2005 | Cok et al. ............... | 313/504 |
| 2005/0237279 A1 | 10/2005 | Chen et al. | |

FOREIGN PATENT DOCUMENTS

EP 1 538 668 A2 6/2005
JP 2005310782 A * 11/2005

* cited by examiner

*Primary Examiner* — Nimeshkumar Patel
*Assistant Examiner* — Christopher Raabe
(74) *Attorney, Agent, or Firm* — Morgan, Lewis & Bockius LLP

(57) ABSTRACT

An organic light emitting display (OLED) includes a substrate, first and second driving units positioned on the substrate, a first light emitting diode (LED) connected with the first driving unit and including a first organic light emitting layer and a second emitting diode electrically connected with the second driving unit and including a second organic light emitting layer. The second emitting diode is positioned on the first emitting diode.

10 Claims, 2 Drawing Sheets

ORGANIC LIGHT EMITTING DISPLAY

This nonprovisional application claims priority under 35 U.S.C. §119(a) on Patent Application Nos. 10-2006-0006010 and 10-2006-0006537 filed in Republic of Korea on Jan. 19, 2006 and Jan. 20, 2006, respectively, the entire contents of which are hereby incorporated by reference.

BACKGROUND

1. Field

This document relates to an organic light emitting display (OLED).

2. Related Art

Among flat panel display devices, light emitting display has an advantage in that it has high response speed and low power consumption. The light emitting display can also be manufactured thin in size and light in weight because of not requiring backlight unit.

In particularly, organic light emitting display (OLED) has an organic light emitting layer between an anode and a cathode. Holes from the anode and electrons from the cathode are combined within the organic light emitting layer to create hole-electron pairs, i.e., excitons. The OLED emits light by energy generated while the excitons return to ground state.

Recently, dual emission type OLED is increasingly employed for mobile communication devices such as mobile phones.

In one related art, dual emission type OLED was fabricated such that two panels were separately fabricated and then attached. In this case, the fabrication cost of the device increased and the device became thick because the two separate panels were attached.

In another related art, dual emission type OLED comprised sub-pixels each having a top emission region and a bottom emission region. But, the device cannot obtain a sufficient emitting area because each single pixel is divided into the two parts, so its luminance is reduced.

SUMMARY

An aspect of this document is to provide an organic light emitting display (OLED) which is fabricated at a low cost, thinner and has an improved luminance.

In an aspect, the OLED comprises a substrate, first and second driving units positioned on the substrate, a first light emitting diode (LED) connected with the first driving unit and comprising a first organic light emitting layer and a second emitting diode electrically connected with the second driving unit and comprising a second organic light emitting layer.

BRIEF DESCRIPTION OF THE DRAWINGS

The implementation of this document will be described in detail Referring to the following drawings in which like numerals refer to like elements.

DESCRIPTION

Hereinafter, an implementation of this document will be described in detail referring to the attached drawings.

First Embodiment

Figure 1:
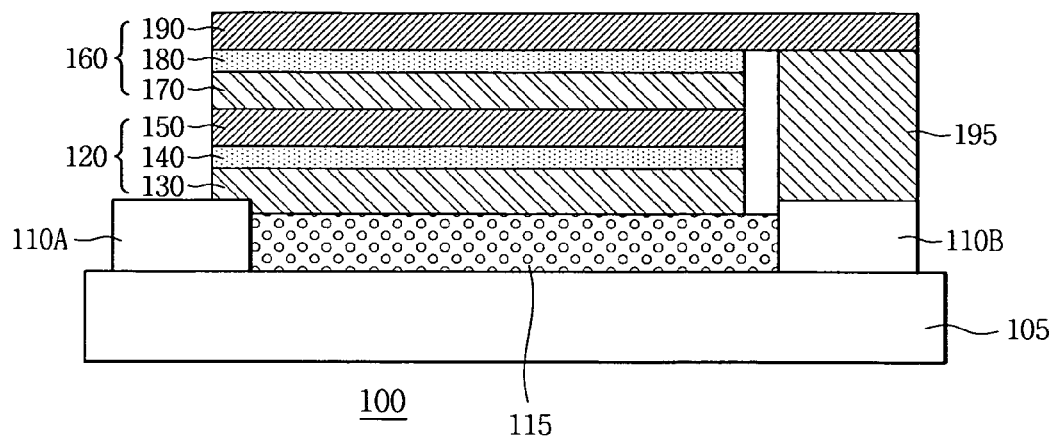
FIG. 1 is a sectional view showing an organic light emitting display (OLED) according to a first embodiment of this document.

Referring to FIG. 1, an organic light emitting display (OLED) 100 according to a first embodiment of the present invention comprises a first unit and a second driving unit 110A and 110B positioned on a substrate 105. The first and second driving units 110A and 110B comprise at least one driving transistor, respectively. Herein, although not shown, the driving transistor may comprise a semiconductor layer, a gate electrode positioned corresponding to the semiconductor layer, a gate insulation layer positioned between the semiconductor layer and the gate electrode, and source and drain electrodes electrically connected with the semiconductor layer. The first and second driving units 110A and 110B may further comprise a switching transistor and a capacitor, respectively.

An insulation layer 115 is positioned on the first and second driving units 110A and 110B. The insulation layer 115 can be an insulation layer for planarization and comprise a transparent dielectric material. The insulation layer 115 can be formed to expose the source and drain electrodes of the driving units 110A and 110B. In FIG. 1, the insulation layer 115 is formed to be lower than the driving units 110A and 110B, but without being limited thereto, the insulation layer 115 can be formed to be higher than the driving units 110A and 110B so long as it can expose the source or drain electrode of the driving units 110A and 110B via a via hole.

A first emitting diode 120 electrically connected with the first driving unit 110A is positioned on the first driving unit 110A and the insulation layer 115. And a second emitting diode 160 electrically connected with the second driving unit 110B is positioned on the first emitting diode 120.

Here, the first emitting diode 120 comprises a first anode 130, a first organic light emitting layer 140 and a first cathode 150, and the second emitting diode 160 comprises a second anode 170, a second organic light emitting layer 180 and a second cathode 190. Accordingly, the first cathode 150 and the second anode 170 electrically contact with each other.

The first anode 130 of the first emitting diode 120 is electrically connected with the first driving unit 110A, and the second cathode 190 of the second emitting diode 160 is electrically connected with the second driving unit 110B. In this case, because of height difference between the second emitting diode 160 and the second driving unit 110B, a connection layer 195 can be positioned on the second driving unit 110B. Thus, the second cathode 190 can be electrically connected with the second driving unit 110B via the connection layer 195.

Although not shown, a metal wiring for supplying power can be connected with the first cathode 150 and the second anode 170.

The first and second anodes 130 and 170 may comprise a material with a high work function, for example, indium tin oxide (ITO), and the first and second cathodes 150 and 190 may comprise one or more of metals such as Al, Ca, Mg, and LIF/Al which have a low work function and high reflexibility. In particular, the second cathode 190 can be a transflective electrode comprising a transparent conductive layer and a metallic layer or a transflective electrode made of a thin metal.

Because the first cathode 150 comprising metal is positioned under the second anode 170, light generated from the second emitting diode 160 can be reflected by the first cathode 150 and then emitted to an upper side of the second emitting diode 160. Light generated from the first emitting diode 120 can be reflected by the first cathode 150 and then emitted to a lower side of the first emitting diode 120.

As described above, in the first embodiment of the present invention, with the bottom-emission type first emitting diode 120 and the top-emission type second emitting diode 160 formed in the stacked structure, the dual emission type OLED can be implemented without reducing an aperture ratio.

In addition, because the first emitting diode 120 and the second emitting diode 160 are electrically connected with the first and second driving units 110A and 110B, respectively, they can be separately driven, so power consumption can be reduced and the screens can be effectively changed.

Second Embodiment

Figure 2:
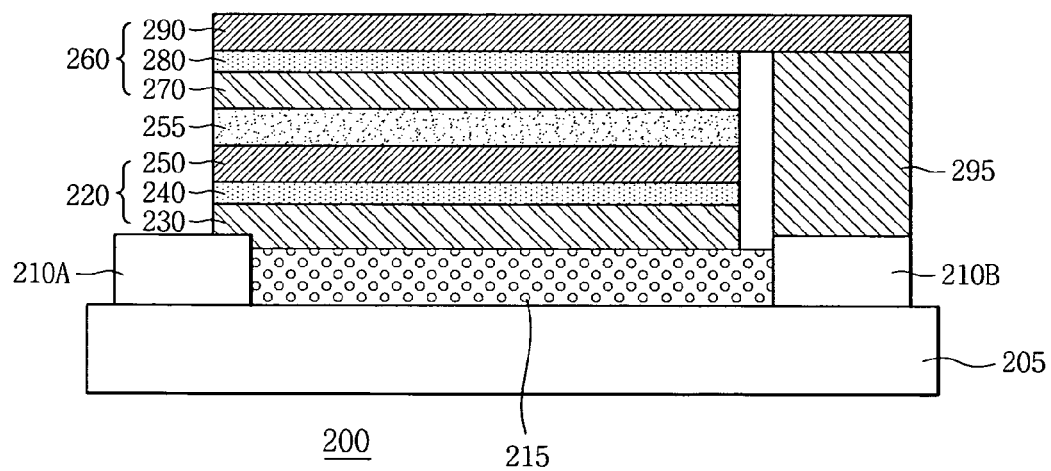
FIG. 2 is a sectional view showing an OLED according to a second embodiment of this document.

Referring to FIG. 2, an OLED 200 according to a second embodiment of the present invention includes first and second driving units 210A and 210B positioned on a substrate 205. The first and second driving units 210A and 210B comprise at least one driving transistor, respectively.

A first insulation layer 215 is positioned on the first and second driving units 210A and 210B. The first insulation layer 215 can be formed to expose source or drain electrode of the first and second driving units 210A and 210B.

A first emitting diode 220 electrically connected with the first driving unit 210A is positioned on the first driving unit 210A and the first insulation layer 215. A second emitting diode 260 electrically connected with the second driving unit 210B is positioned on the first emitting diode 220, and a second insulation layer 255 is positioned between the first and second emitting diodes 220 and 260.

Here, the first emitting diode 220 includes a first anode 230, a first organic light emitting layer 240 and a first cathode 250, and the second emitting diode 260 includes a second anode 270, a second organic light emitting layer 280 and a second cathode 290.

The first anode 230 of the first emitting diode 220 is electrically connected with the first driving unit 210A, and the second cathode 290 is electrically connected with the second driving unit 210B. In this case, because of a height difference between the second emitting diode 260 and the second driving unit 210B, a connection layer 295 can be positioned on the second driving unit. Accordingly, the second cathode 290 can be electrically connected with the second driving unit 210B via the connection layer 295.

Although not shown, a metal wiring for supplying power can be connected with the first cathode 250 and the second anode 270.

The first and second anodes 230 and 270 may comprise a material with a high work function, for example, ITO, and the first and second cathodes 250 and 290 may comprise one or more of metals such as Al, Ca, Mg, and LIF/Al which have a low work function and high reflexibility. In particular, the second cathode 290 can be a thin transflective electrode.

Because the first cathode 250 comprising metal is positioned under the second anode 270, light generated from the second emitting diode 260 can be reflected by the first cathode 250 and then emitted to an upper side of the second emitting diode 260. Light generated from the first emitting diode 220 can be reflected by the first cathode 250 and then emitted to a lower side of the first emitting diode 220.

As described above, in the second embodiment of the present invention, with the bottom-emission type first emitting diode 220 and the top-emission type second emitting diode 260 formed in the stacked structure, an aperture ratio of the OLED is not reduced. In addition, because the first and second emitting diodes 220 and 260 are electrically connected with the first and second driving units 210A and 210B, respectively, the first and second emitting diodes 220 and 260 can be driven separately.

Also electrodes that comprise each different material cannot contact with each other, because the second insulation layer 255 is positioned between the first and second emitting diodes 220 and 260, so a driving voltage can be reduced.

Third Embodiment

Figure 3:
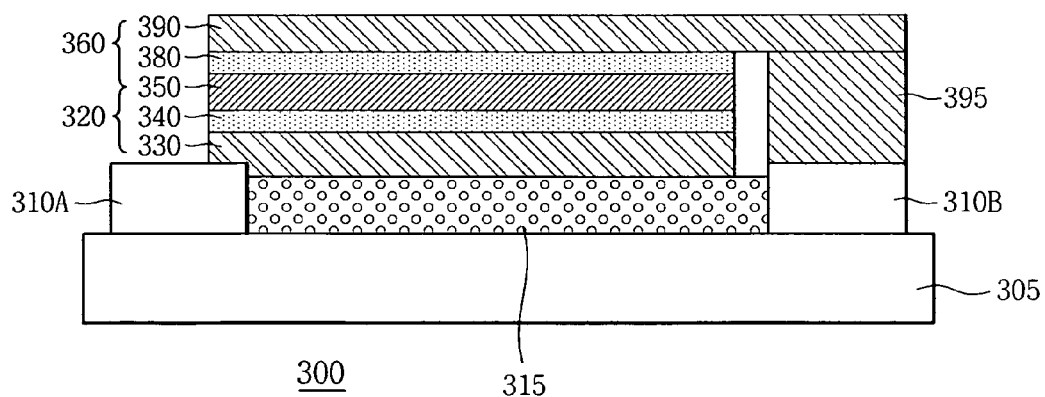
FIG. 3 is a sectional view showing an OLED according to a third embodiment of this document.

Referring to FIG. 3, an OLED 300 according to a third embodiment of the present invention includes first and second driving units 310A and 310B positioned on a substrate 305. The first and second driving units 310A and 310B comprise at least one driving transistor, respectively.

An insulation layer 315 is positioned on the first and second driving units 310A and 310B. The insulation layer 315 can be formed to expose source or drain electrode of the first and second driving units 310A and 310B.

A first emitting diode 320 electrically connected with the first driving unit 310A is positioned on the first driving unit 310A and the insulation layer 315. A second emitting diode 360 electrically connected with the second driving unit 310B is positioned on the first emitting diode 320.

Here, a first electrode 330 is positioned under a first organic light emitting layer 340, a second electrode 390 is positioned on a second organic light emitting layer 380, and a third electrode 350 is positioned between the first and second organic light emitting layers 340 and 380.

Namely, the first and second electrodes 330 and 390 are anodes of the first and second emitting diodes 320 and 360, respectively, and the third electrode 350 is a common cathode of the first and second emitting diodes 320 and 360.

The first electrode 330 is electrically connected with the first driving unit 310A, and the second electrode 390 is electrically connected with the second driving unit 310B. In this case, because of height difference between the second emitting diode 360 and the second driving unit 310B, a connection layer 395 can be positioned on the second driving unit 310B to resolve the step. Accordingly, the second electrode 390 can be electrically connected with the second driving unit 310B via the connection layer 395. Although not shown, a metal wiring for supplying power can be connected with the third electrode 350.

The first and second electrodes 330 and 390 may comprise a material with a high work function, for example, ITO, and the third electrode 350 may comprise one or more of metals such as Al, Ca, Mg, and LIF/Al which have a low work function and high reflexibility.

Accordingly, light generated from the first and second organic light emitting layers 340 and 380 is reflected by the third electrode 350, the common cathode, and emitted toward the first and second electrodes 330 and 390, respectively.

As described above, the OLED 300 according to the third embodiment of the present invention has such an advantage in that it has a large emitting area and a separate driving can be possibly performed.

In addition, because the OLED 300 uses the third electrode 350 as the common cathode of the first and second emitting diodes 320 and 360, a processing time and cost for its fabrication can be reduced and the OLED can be implemented to be thinner.

Fourth Embodiment

Figure 4:
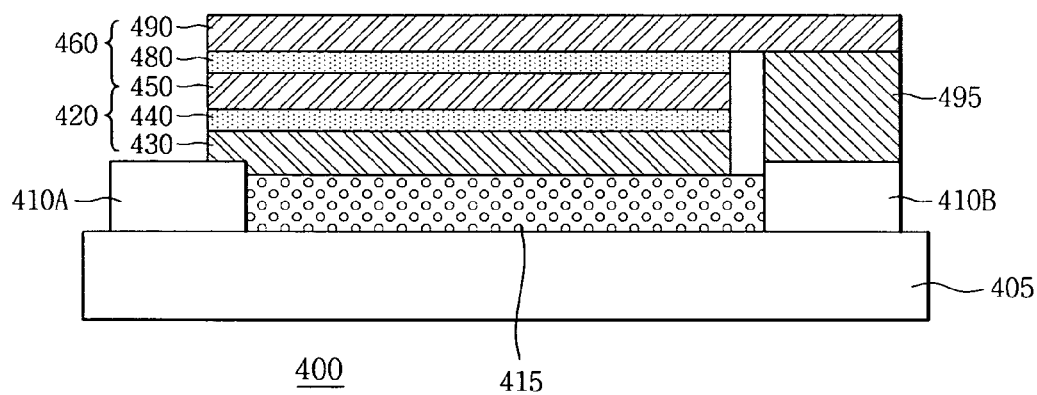
FIG. 4 is a sectional view showing an OLED according to a fourth embodiment of this document.

Referring to FIG. 4, in the OLED 400 according to the fourth embodiment of the present invention, a first electrode 430 is used as an anode of a first emitting diode 420 and a third electrode 490 is used as a cathode of the second emitting diode 490. A third electrode 450 is used as a cathode of the first emitting diode 420 and as an anode of a second emitting diode 460.

Although the third electrode 450 is used as the common electrode of the first and second emitting diodes 420 and 460, it plays a different role in each emitting diode. Thus, in this case, the third electrode 450 cannot have a proper work function in performing the two roles.

Thus, the third electrode 450 can be made of a metal having a low work function, and surface treatment is performed on one surface of the third electrode to have a high work function by using at least one of mechanical, chemical, plasma, laser surface processing methods in order to increase the work function. The treated surface of the third electrode is opposite to the second emitting layer in third electrode In other words, the second electrode 450 can perform the role of the cathode of the first emitting diode 420 by comprising a metal having a low work function and also perform the role of the anode of the second emitting diode 460 by comprising one surface having a high work function.

In the above-described embodiments of the present invention, the first and second driving units are positioned on the same planar surface, but without being limited thereto.

Although the present invention has been described with reference to certain exemplary embodiments, it will be understood by those skilled in the art that a variety of modifications and variations may be made to the present invention without departing from the spirit or scope of the present invention defined in the appended claims, and their equivalents.

What is claimed is:

1. An organic light emitting display comprising:
    a substrate;
    a first and a second driving units positioned on the substrate so that the first and the second driving units are separated from each other;
    an first insulation layer positioned between the first and second driving units to isolate the first driving unit from the second driving unit;
    a first light emitting diode positioned on the first insulation layer, electrically connected with the first driving unit, and comprising a first organic light emitting layer;
    a second emitting diode positioned on the first light emitting diode, and electrically connected with the second driving unit, the second light emitting diode comprising a second organic light emitting layer and an upper electrode positioned on the second organic light emitting layer, and
    a connection layer positioned on the second driving unit, extending from the second driving unit to the upper electrode along the first light emitting diode and the second light emitting diode, and electrically connecting the upper electrode of the second emitting diode to the second driving unit,
    wherein the first emitting diode is positioned on the first insulation layer, and the second emitting diode is positioned on the first emitting diode,
    wherein a height of the first and the second driving units is higher than that of the first insulation layer.

2. The display of claim 1, wherein the first emitting diode is a bottom-emission type and the second emitting diode is a top-emission type.

3. The display of claim 1, wherein the first emitting diode comprises a first electrode positioned at a lower portion of the first organic light emitting layer and electrically connected with the first driving unit and a second electrode positioned at an upper portion of the first organic light emitting layer, and the second emitting diode comprises a third electrode positioned at a lower portion of the second organic light emitting layer and a fourth electrode positioned at an upper portion of the second organic light emitting layer and electrically connected with the second driving unit, wherein the fourth electrode is the upper electrode.

4. The display of claim 3, wherein the fourth electrode is a transflective electrode.

5. The display of claim 4, wherein the first and third electrodes are anodes, the second and fourth electrodes are cathodes, and the second and third electrodes electrically contact with each other.

6. The display of claim 4, wherein the first and third electrodes are anodes, the second and fourth electrodes are cathodes, and an second insulation layer is positioned between the first and second emitting diodes.

7. The display of claim 1, wherein the first emitting diode comprises a first electrode positioned at a lower portion of the first organic light emitting layer and electrically connected with the first driving unit,
    wherein the second emitting diode comprises a second electrode positioned at an upper portion of the second organic light emitting layer and electrically connected with the second driving unit,
    wherein a third electrode is positioned between the first and second organic light emitting layers.

8. The display of claim 7, wherein the first and second electrodes are anodes, and the third electrode is a cathode.

9. The display of claim 7, wherein the first electrode is an anode, the second electrode is a cathode, and the third electrode comprises a metal, wherein a surface opposing the second emitting layer in the third electrode is surface-treated.

10. The display of claim 9, wherein the surface treatment is one selected from the group consisting of a mechanical treatment, a chemical treatment, a plasma treatment, and a laser treatment.

* * * * *